(12) United States Patent
Fermann

(10) Patent No.: US 6,778,732 B1
(45) Date of Patent: Aug. 17, 2004

(54) GENERATION OF HIGH-POWER, HIGH BRIGHTNESS OPTICAL BEAMS BY OPTICAL CUTTING AND BEAM-SHAPING OF DIODE LASERS

(75) Inventor: Martin E. Fermann, Franklin, MA (US)

(73) Assignee: Boston Laser, Inc., Binghamton, NY (US)

( * ) Notice: Subject to any disclaimer, the term of this patent is extended or adjusted under 35 U.S.C. 154(b) by 130 days.

(21) Appl. No.: 10/163,999

(22) Filed: Jun. 7, 2002

(51) Int. Cl.[7] .............................. G02B 6/26; G02B 6/42; G02B 11/00
(52) U.S. Cl. ............................ 385/31; 385/33; 359/642
(58) Field of Search .............. 385/31, 33; 359/642–830

(56) References Cited

U.S. PATENT DOCUMENTS

| | | | |
|---|---|---|---|
| 4,884,281 A | * 11/1989 | Hawthorn et al. | ............ 372/75 |
| 5,168,401 A | 12/1992 | Endriz | |
| 5,243,619 A | 9/1993 | Albers et al. | |
| 5,418,880 A | * 5/1995 | Lewis et al. | ............... 385/123 |
| 5,825,551 A | 10/1998 | Clarkson et al. | |
| 5,887,096 A | 3/1999 | Du et al. | |
| 5,987,794 A | 11/1999 | Lavi et al. | |
| 6,044,096 A | 3/2000 | Wolak et al. | |
| 6,151,168 A | * 11/2000 | Goering et al. | ............. 359/623 |
| 6,243,210 B1 | * 6/2001 | Yan | ........................... 359/641 |
| 6,529,542 B1 | * 3/2003 | Karlsen et al. | ............. 372/108 |
| 2002/0015558 A1 | 2/2002 | Lissotschenko et al. | |
| 2002/0159156 A1 | * 10/2002 | Wohlstadter | ............... 359/626 |

FOREIGN PATENT DOCUMENTS

DE     199 20 293 B1    5/2000

OTHER PUBLICATIONS

Beach, et al., "Practical 100–kW–class diode arrays emerge", *LaserFocusWorld*, (Dec. 2001).

* cited by examiner

Primary Examiner—John D. Lee
Assistant Examiner—Tina M Lin
(74) Attorney, Agent, or Firm—Fulbright & Jaworski LLP

(57) ABSTRACT

An optical beam-shaping element is used to produce a high brightness laser beam from a diode bar or a single emitter diode, allowing for efficient coupling of the beam into an optical fiber. An embodiment of the beam-shaping element allows the construction of a quasi-monolithic beam shaper incorporating both fast axis collimation as well as beam rotation. Additional slow axis collimation of the individual emitting elements of the diode bar is also possible in one quasi-monolithic design. The beam rotation element may comprise an array of beam-inverting planar grin lenses aligned with their axes of equal refractive index at an angle of ±45° with respect to the slow axes of the emitters. Alternative embodiments comprise beam rotation elements based on Fresnel lens arrays or aspheric cylindrical lens arrays. The beam-shaping element can be used in conjunction with stacks of diode bars, where optical cutting of the diode bar beams in a parallelepiped coated with multiple reflective stripes can be further implemented to symmetrize the resulting optical beam. Alternatively optical beams of ultra-high power can be generated by combining multiple fiber coupled diode bars in a fiber bundle incorporating rectangular fiber cores, metallization and a heat sink.

44 Claims, 12 Drawing Sheets

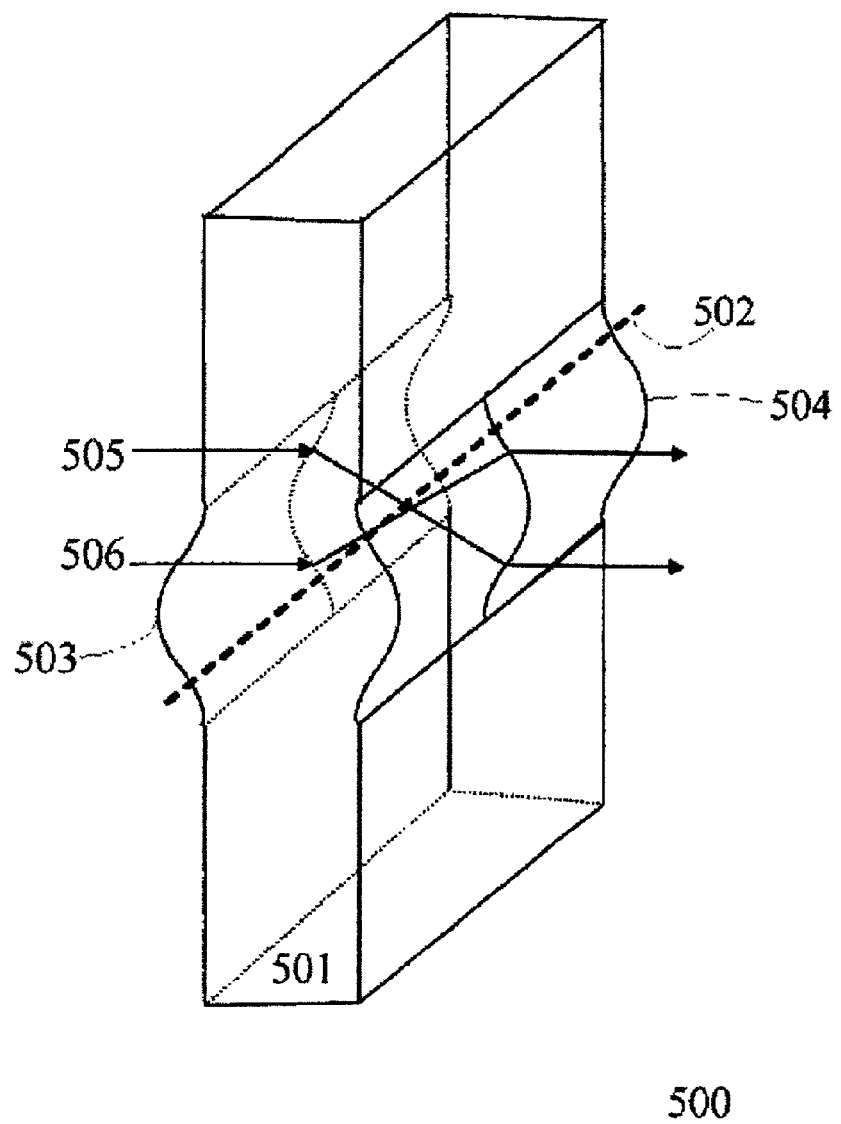
Fig. 5)

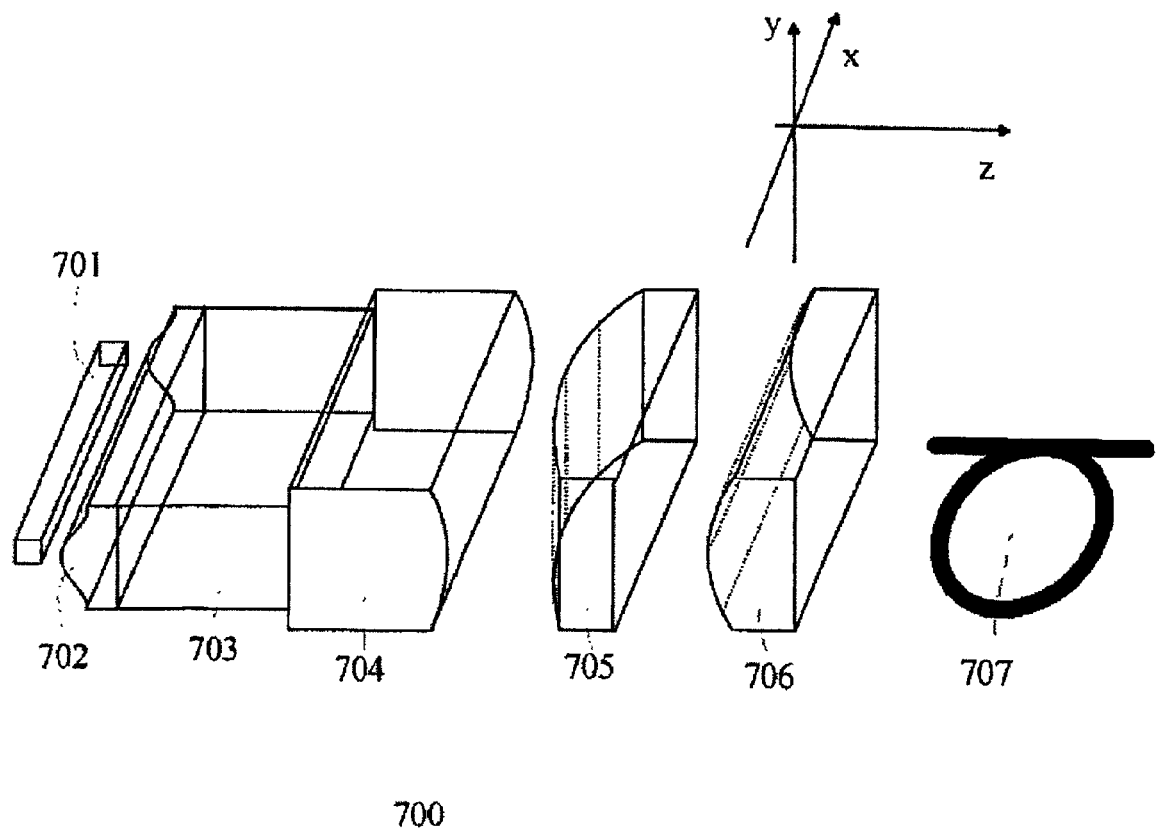
Fig. 7)

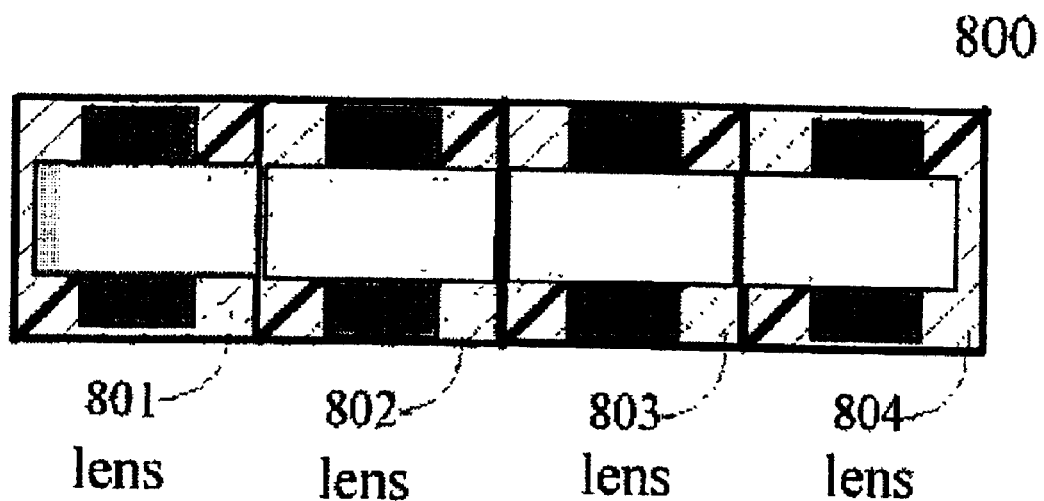
801 lens  802 lens  803 lens  804 lens
Fig. 8)

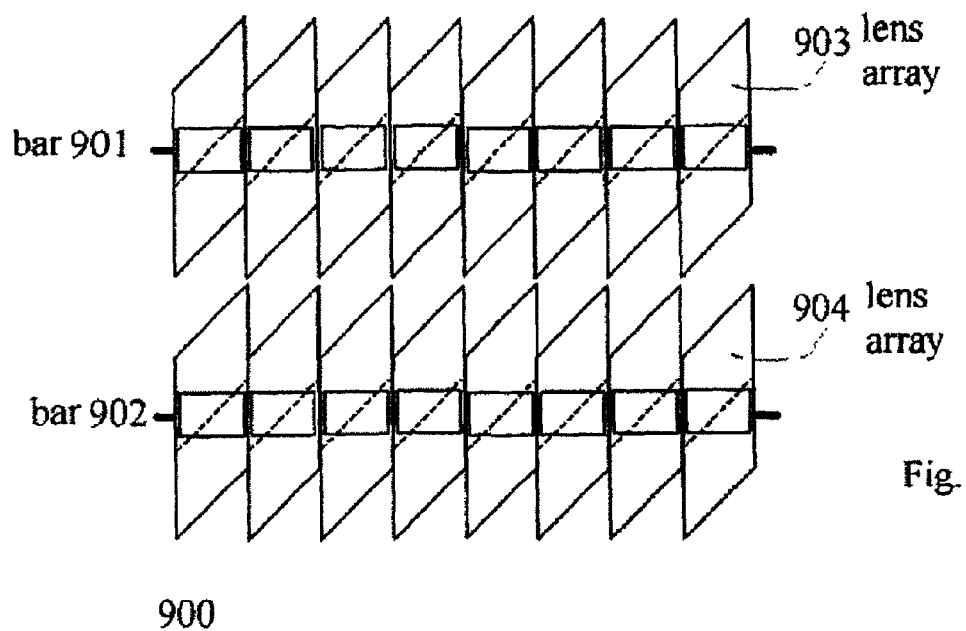
Fig. 9A
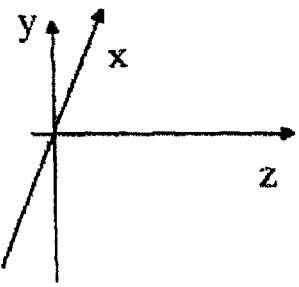
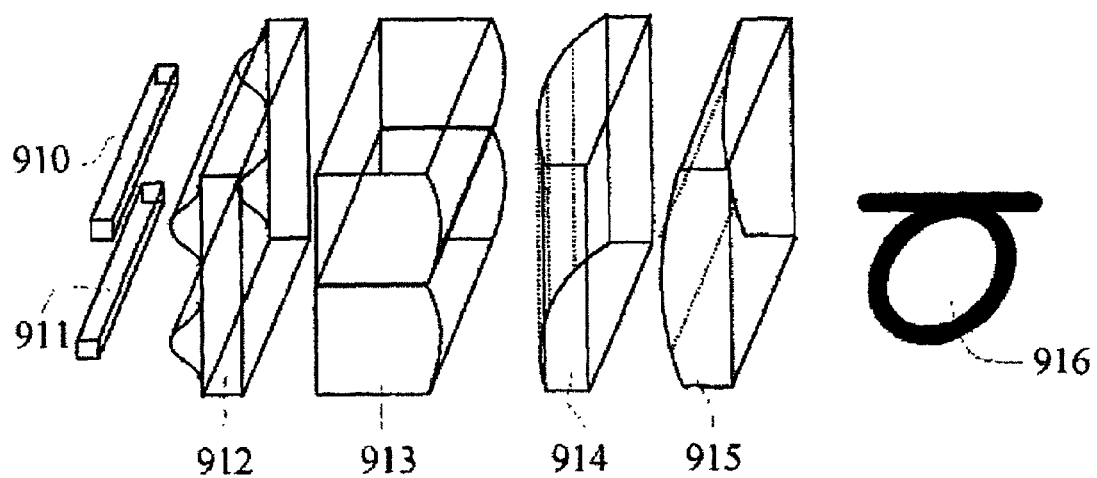
Fig. 9B

GENERATION OF HIGH-POWER, HIGH BRIGHTNESS OPTICAL BEAMS BY OPTICAL CUTTING AND BEAM-SHAPING OF DIODE LASERS

FILED OF THE INVENTION

The present invention relates to diode lasers and more particularly, a configuration of and a method for optical beam-shaping of diode laser bars to produce an optical beam of high power and brightness, allowing for efficient coupling of the optical diode laser bar output into an optical fiber.

DESCRIPTION OF THE PRIOR ART

High power solid state lasers and particularly high power fiber lasers generally depend on the availability of optical pump beams with high optical power and brightness, i.e., the required pump power needs to be made available in as small a space as possible. Semiconductor diode laser arrays are firmly established as the main source of high power optical beams, i.e., 1 watt and greater including ultra-high powers of greater than 10 watts. With current semiconductor technology, a power approaching 40 kW can be produced by a stacked diode array measuring only 5×10 cm in size (R. J. Beach et al., Laser Focus World, December 2001).

The stacked diode array typically consists of individual diode bars of around 1 cm in-length, which in turn incorporate 10–50 individual 100–200 $\mu$m long emitters spaced 0.1–1.0 mm apart. Generally, the total length of the individual emitters comprises only a fraction of the total bar length. The ratio $N*l_i/L$, where N is the number of individual emitters, each of length $l_i$, and L is the total length of the diode bar, is referred to as fill factor. In a diode stack the diode bars are typically separated by 1–2 mm and arranged in tiles of 10–20. Each bar typically produces a cw (continuous wave) power up to 100 W. Thus for 40 kW of power, 400 bars are needed.

A laser beam originating from one individual emitter typically has a divergence of 10°×50°. The small divergence beam is in the plane of the x axis and the high divergence beam is in the plane of the y axis. These axes are sometimes referred to as slow and fast axis respectively. The fast axis beam is generally diffraction limited and can be collimated to within a fraction of the diffraction limit with a cylindrical lens aligned parallel to the slow axis of the single emitter. The slow axis beam is typically 10–20 times diffraction limited.

The brightness B of the optical beam from an individual emitter can be calculated as B=power/(emitting area×angular divergence$_x$×angular divergence$_y$), where angular divergence$_{x,y}$ represents the angular divergence along the x and y axes respectively. For an individual emitter of dimensions 1×100 $\mu$m operating at a power of 4 W a brightness of B=27 MW/cm$_2$ is obtained.

In contrast, the brightness of a diode bar with dimensions 1 $\mu$m×1 cm operating at a power level of 100 W is only about 6.6 MW/cm$_2$, whereas the brightness of a diode stack as described above operating at a power of 40 kW is only of the order of 5 kW/cm$_2$. High brightness diode bars are generally manufactured by maximizing the fill factor; fill factors as high as 80–90% are commonly used to reach bar power levels of 100 W or more.

For many applications, such as fiber coupling, focusing of the diode beams into as small a spot as possible is required, where ideally the dimension of the focused spot should be the same along both axes of the diode beam. The diode bar from the example above emitting a power P=100 W can for example be coupled into a fiber with a diameter of 4 mm and a numerical aperture NA=0.22. However, the fiber coupled brightness B thus reduces to 4 kW/cm$^2$, where the brightness B obtained from a fiber with core area A is calculated as B≈P/(A*$\pi$NA$^2$).

The brightness of diode laser beams has traditionally been increased by the implementation of beam-shaping optics, ie., by optically combining the individual emitter beams from the diode array to generate a single optical beam which can be efficiently coupled into an optical fiber (See, e.g. U.S. Pat. No. 5,168,401 of Endriz, hereinafter Endriz '401).

Optical beam-shaping is possible by a variety of means. A first class of methods uses optical beam rotation of each emitter to rotate the beam by 90°, where the direction of the emitter beam is further deflected by around 90° after reflection from at least two reflecting surfaces. The Endriz '401 patent describes such an example. Further examples of such a method are described in U.S. Pat. No. 5,418,880 of Lewis et al. and U.S. Pat. No. 6,044,096 of Wolak, et al.

A second class of methods is based on optical beam rotation using beam-rotating prisms such as the Abbe-Konig prism as disclosed in U.S. Pat. No. 5,243,619 of Albers et al. The advantage of this design is that it avoids a 90° deflection of the beam direction such that only a small displacement in the propagation direction results.

A third class of methods is based on beam deflection in a set of multi-facetted mirrors or prisms. In these methods a first multi-facetted optical structure deflects the beam to obtain some beam spacing in the y direction, while a second multi-facetted optical structure deflects the beams to overlay the beams along the x direction (see, e.g., U.S. Pat. No. 5,887,096 of Du et al., U.S. Pat. No. 6,151,168 of Goering et al. and U.S. Pat. No. 5,987,794 to Ullmann et al.). Such systems do not require beam rotation optics, but generally employ a beam deflection along the propagation direction, relying on the manufacturing of expensive high precision multi-facet bulk optics. Though the beam-shaping device described by Ulmann et al. can work for high fill factor bars and diode arrays, the optical path lengths of individual beams through the beam-shaping optic are generally different, thereby limiting the focussability of the resulting beam. Moreover, it is difficult to implement this method with bars tightly stacked in one dimension.

The function of beam deflection and overlay can also be accomplished in one single optical element as disclosed by U.S. Pat. No. 5,825,551 of Neilson, et al. A limitation of the approach taken by Neilson et al. is the variation between the optical path lengths of each individual emitter beam through the beam-shaping optic, which in-turn limits the focussability of the resulting beam. Moreover, the adaptation of the technique by Neilson et al. to fiber coupling of diode bar stacks requires two such sets of beam-shaping optics, which is expensive to implement. Note that the first three classes of beam-shaping optics use non-focussing optics.

A fourth class of beam-shaping methods is based on beam rotation in an array of imaging transmissive optical elements that comprises at least one spherical cylindrical surface or a toroidal surface with two different curvatures along two orthogonal axes. (Such an array is described by Lissotschenko et al., German Patent No. DE 19920293 and U.S. Patent Publication No. 2002/0015558) as depicted in FIG. 1. As shown, beam-rotation assembly 100 comprises four pairs of spherical cylindrical lenses 101–104, which beam-rotate four individual beamlets 105–108 emitted from a diode bar with a slow axis represented by line 109. FIG. 1 represents only the front surfaces of the beam-rotating cylindrical lens pairs; the back surfaces of the beam-rotating cylindrical lens pairs are positioned directly behind the front surfaces and are not visible. In FIG. 1 the individual beamlets 105–108 are depicted as squares to represent the approximate extension of the beamlets after collimation of the fast axis. The axes of the cylindrical lenses are aligned at an angle of 45° with respect to the slow axis 109 of the diode bar. To avoid beam-clipping in the cylindrical lenses, the beamlets need to be located centrally within the cylindrical lenses. It can be seen from FIG. 1 that the separation of the individual emitters along the slow axis must be twice their length (for square beamlets) to fit the beam through the beam-shaping optical element. Hence the theoretical maximum allowable diode fill factor is 50%, practical implementations resulting in an actual maximum fill factor of about 40% because of beam-divergence, which restricts the effective aperture of each beam-shaping optical element. Another limitation of the beam-rotating device described by Lissotschenko et al. is that optical aberrations remain uncompensated, hence the effective use of the optical beam-rotating element is limited to small NA optics, increasing the required length of the toroidal cylindrical beam-shaping optic and further limiting the aperture of each toroidal cylindrical lens, resulting in even lower available diode bar fill factors.

Generally all techniques described so far incorporate separately formed optical elements, i.e., are not monolithic, and therefore require complex alignment procedures and resultant high manufacturing costs. Moreover, the application of optical coating(s) is also difficult in these devices which can limit the optical throughput.

A beam-shaping device which can overcome these problems is described in U.S. patent application Ser. No. 10/085,620, filed Mar. 1, 2002, and incorporated herein in its entirety. That device is based on the use of for example planar graded index (grin) lenses or Fresnel lenses with a magnification of M=−1 to achieve beam-rotation by 90° for all the individual emitter elements in a diode bar. Both planar grin lenses and Fresnel lenses allow for essentially aberration free imaging, hence they are not restricted to low numerical apertures. Moreover, monolithic or quasi monolithic beam-shaping elements can be constructed with both planar grin lenses and Fresnel lenses, allowing for effective fiber coupling of diode bars from very compact assemblies.

SUMMARY OF THE INVENTION

The present invention is directed to an optical arrangement allowing efficient coupling of a high-fill factor diode bar into an optical fiber. The device uses low aberration, high NA imaging elements that provide a magnification of M=−1, resulting in beam inversion. Moreover, the individual optical elements are produced in a rhombic form, allowing for side to side alignment of each beam-rotating imaging element without any unused dead space.

The beam inversion optic is based on arrays of grin lenses, cylindrical Fresnel lenses or aspheric cylindrical lenses. The graded index optic is preferably planar, where beam inversion is obtained by aligning the lines of equal refractive index at an angle of approximately ±45° (as used herein, the "±" sign refers to an angular displacement of the specified amount in both positive and negative rotational directions and not to a range of angular displacements) with respect to the slow axis of the individual emitters. In the case of cylindrical Fresnel lenses, the lines of equal phase retardation are equally aligned at an angle of approximately ±45° with respect to the slow axis of the individual emitters. In the case of aspheric cylindrical optics, the cylinder axis is also aligned at an angle of approximately ±45° with respect to the slow axis of the individual emitters.

Beam inversion is further facilitated by first collimating the fast axis of the individual emitters with a single cylindrical lens aligned parallel to the slow axis of the diode bar. Highly integrated monolithic beam inversion optical systems are also possible. The monolithic beam inversion optical system comprises an integrated fast axis collimation element in conjunction with a beam rotation element. An additional slow axis collimating element can also be incorporated in a monolithic fashion. The beam inversion optic can further be used for beam-shaping of the output of individual emitters, facilitating efficient coupling of the output into optical fibers.

Ultra-high power optical beams can be obtained by implementing the beam-inverting optic with stacks of diode bars, where arrays of beam-shaping optics can be readily implemented. Additional beam-cutting optics can be incorporated to facilitate coupling into a required fiber size.

Alternatively, ultra-high power optical beams can be obtained by combining the output of individual fiber-coupled diode bars into an optical fiber bundle that is operated in conjunction with an efficient heat sink; for optimum brightness conservation the fibers can be designed with a rectangular cross section.

BRIEF DESCRIPTION OF THE DRAWINGS

FIG. 5 is a diagram of an array of high numerical aperture (NA) aspheric cylindrical focusing optical elements for beam-shaping according to an embodiment of the present invention;

FIG. 7 is a diagram of an ultra-compact integrated beam-shaping optical element as used in fiber coupling according to an embodiment of the present invention;

FIG. 8 is a diagram of beam-shaping of a single-emitter diode laser according to an embodiment of the present invention;

FIG. 9A is a diagram of beam-shaping optic for a diode laser stack according to an embodiment of the present invention;

FIG. 9B is a diagram of an optical design allowing coupling of a diode bar stack output into an optical fiber according to an embodiment of the present invention;

DESCRIPTION OF THE PREFERRED EMBODIMENT

Figure 2:
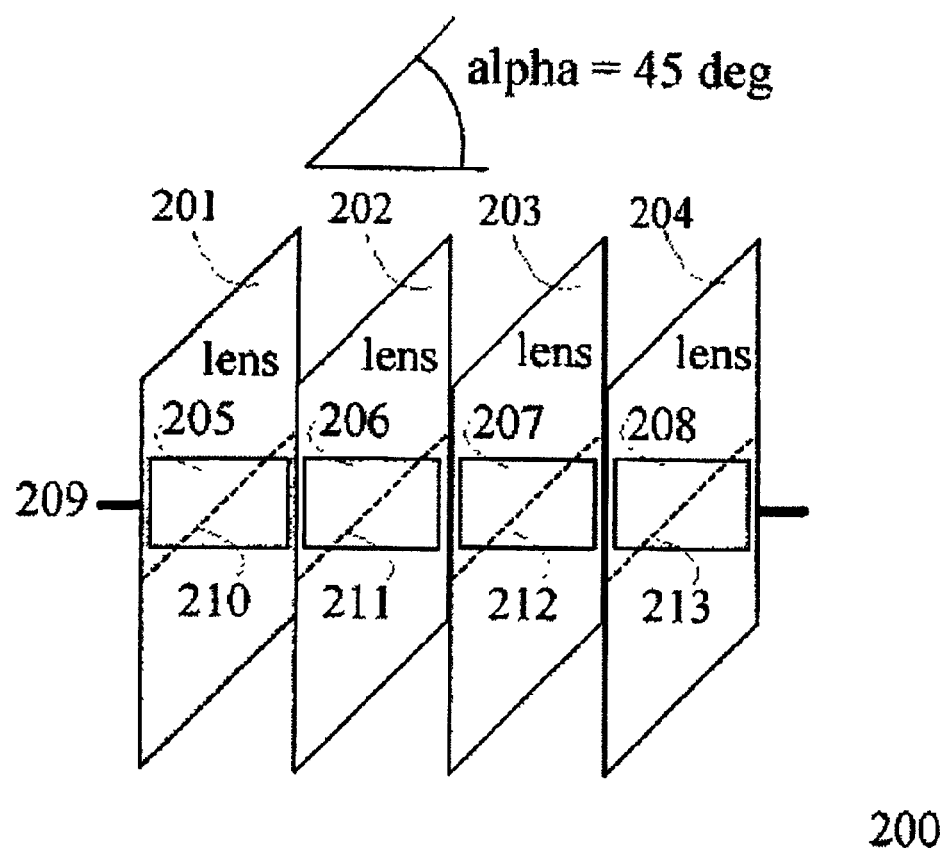
FIG. 2 is a diagram of an array of planar grin lenses of a rhombic form.

FIG. 2 represents an array of planar grin lenses according to an exemplary embodiment of the present invention. The planar grin lens array 200 comprises four planar grin lenses 201–204. Four grin lenses are shown only for simplicity; a beam-shaping grin lens array typically comprises 10–20 grin lenses although other numbers of lenses may be used. Four collimated beamlets 205–208 are aligned in front of the beam-shaping grin lens array, such that each beamlet can be transmitted through an individual grin lens without clipping, as indicated in FIG. 2. The beamlets are emitted from a diode bar with its slow axis represented by line 209. The divergence of the collimated diode bar is typically of the order of 10° along the slow axis and designed (by appropriate selection of collimation optics) to lie in the range 0.1°–2° along the fast axis (orthogonal to the slow axis). The divergence of each beamlet is similar to the divergence of the whole diode bar.

Each planar grin lens comprises lines of equal refractive index, which are parallel to the line of maximum refractive index. For the grin lenses, these lines of maximum refractive index are indicated by dotted lines 210–213. In the following we refer to the lines of maximum refractive index as central symmetry lines. The lines of equal refractive index are aligned at an angle a (alpha) of approximately 45° with respect to the slow axis 209 of the diode bar. Alternatively, an angle of −45° (i.e., in the opposite direction) can be chosen. The refractive index along a line orthogonal to the lines of equal refractive index typically follows a near parabolic profile, where the highest refractive index is obtained in the center of the planar grin lens. The refractive index along the direction of beam-propagation (orthogonal to the slow and fast axes) is approximately constant.

After propagation through a grin lens with a pitch p of approximately p≈0.5, each planar grin lens produces a magnification of M=−1, resulting in beam inversion. As a consequence of beam inversion the individual beamlets are rotated by ≈90°; moreover, the divergence of the beamlets is flipped, i.e., the direction of the slow and fast axes inside the beamlets are interchanged. Since the grin lens array represents an optical imaging system, to obtain optimum beam-rotation, optical aberrations need to be held to a minimum, as accomplished by grin lenses. Assuming the divergence along the slow axis of a beam-shaped 1 cm long diode bar is 0.5°, the bar can be coupled into a fiber with a diameter of 200 μm and NA=0.22. No appreciable loss in brightness is thus suffered by fiber coupling.

Figure 1:
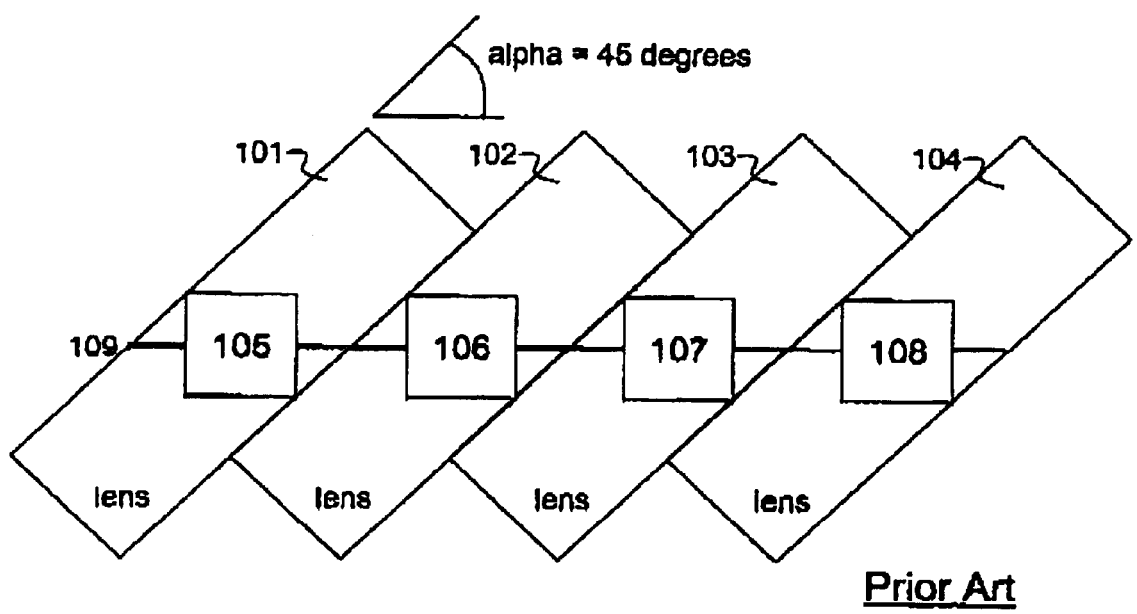
FIG. 1 is a diagram of a prior art beam-shaping apparatus.

Clearly a rhombic cut for the grin lenses allows for the tightest spacing of the beamlets next to each other. To reduce any aperture limiting effects due to divergence, the length of the beam-shaping optic should further be minimized to be as short possible, calling for a grin lens numerical aperture NA>0.20. Though the individual grin lenses are shown to have a rhombic layout, the exact form of both the top and bottom of the grin lenses is not significant. The smallest beamlet spacing is obtained with grin lenses that are cut individually at an angle of 45° with respect to the lines of equal refractive index. Such a design is most easily manufactured with lenses of rhombic form; for low fill factor bars the grin lenses can be stacked on top of each other similar to the layout displayed in FIG. 1. However, superior imaging can be obtained with grin lenses compared to lenses with prior art spherical toroidal concave surfaces due to greatly reduced optical aberrations.

Figure 3:
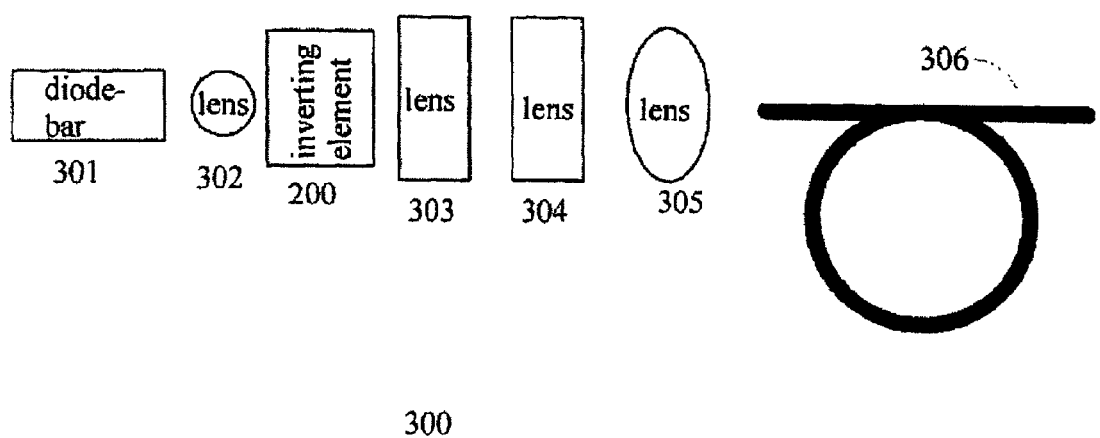
FIG. 3 is a diagram of an optical design allowing coupling of a diode bar output into an optical fiber according to an embodiment of the present invention.

Referring to FIG. 3, an optical arrangement 300 using a beam inverter for coupling an output from a diode array into an optical fiber is illustrated. Diode bar 301 is collimated along the fast axis by cylindrical collimation lens 302. The individual beamlets are rotated by 90° by the beam inverting element 200. An additional set of cylindrical and/or spherical lenses 303, 304, 305 (more than three lenses may be used) is then used to couple the diode beam into optical fiber 306.

Figure 4A:
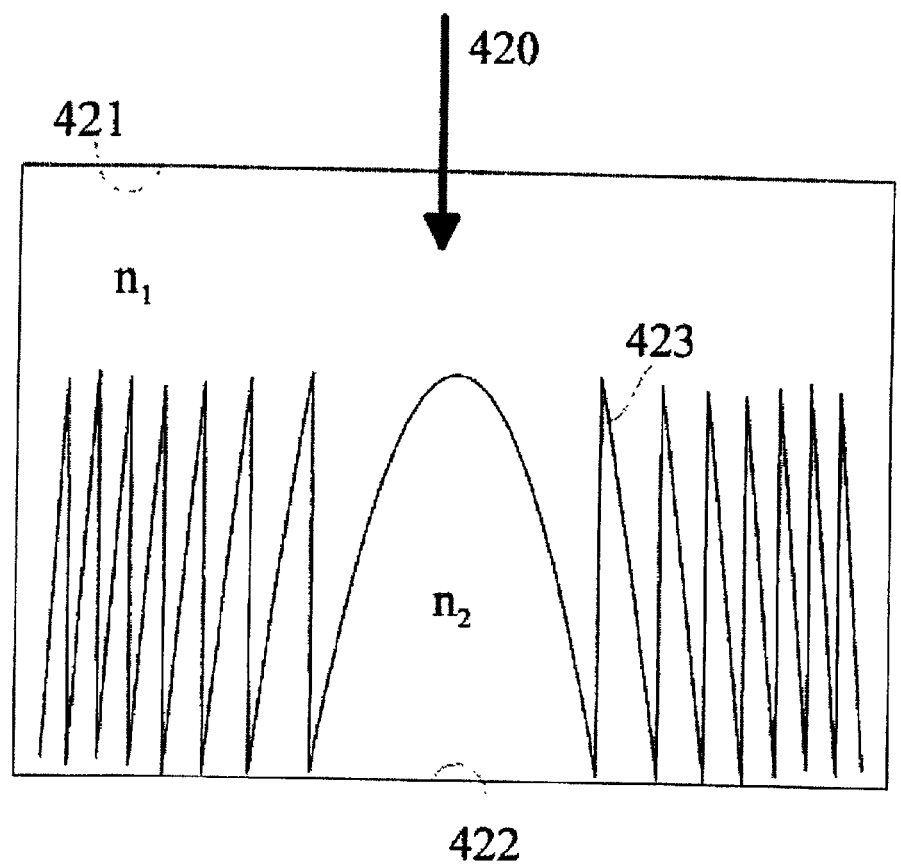
FIG. 4A is a diagram of the design of a beam-shaping cylindrical Fresnel lens.
Figure 4B:
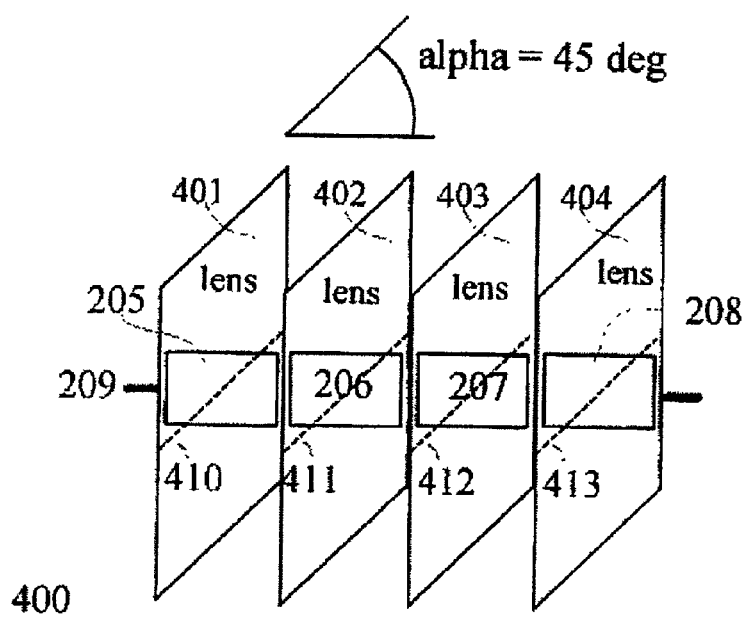
FIG. 4B is diagram of an array of beam-shaping cylindrical Fresnel lenses of rhombic form according to an embodiment of the present invention.

Whereas the embodiment described above includes planar grin lens arrays as elements to achieve optical beam rotation, a more general beam-inverting optic with a magnification of M=−1 can be used instead. FIGS. 4A and 4B depict a beam rotation optical element comprised of arrays of cylindrical Fresnel lenses. An example of a cross section of a cylindrical Fresnel lens with a high diffraction efficiency is shown in FIG. 4A, where the propagation direction is indicated by downwardly pointing arrow 420. A Fresnel lens can have external flat interfaces 421, 422; i.e., the index step at the Fresnel surface 423 can be buried within the body of the lens. Alternatively, the Fresnel surface 423 can be exposed to air or other ambient environment. FIG. 4A is to serve only as an example of the possible design of a Fresnel lens. Other designs are well known in the state of the art and can comprise refractive index steps in the direction orthogonal to the propagation direction based on graded index structures. Alternative Fresnel lens designs are not separately shown here. The operation of Fresnel lenses can be understood by assuming a grating with a radially (orthogonal to the propagation direction) dependent grating period, producing essentially aberration-free imaging even for numerical apertures greater than 0.3.

To achieve beam-rotation of the beamlet in a diode bar, beam propagation through two successive cylindrical Fresnel lens arrays can be used for beam inversion. The pair of Fresnel lens arrays can be fabricated directly on the front and back surfaces of a substrate and aligned such that the two Fresnel lens arrays exactly overlay each other.

To obtain optimum beam inversion the distance between the Fresnel lens arrays needs to be 2×f, where f is the focal length of one Fresnel lens. An example of the alignment of the Fresnel lens arrays with respect to a diode laser bar is shown in FIG. 4B. Only one of the Fresnel lens arrays comprised of 4 Fresnel lenses 401–404 is shown; the second Fresnel lens array is assumed to lie directly behind the first array, where the direction of propagation is along the surface normals of the Fresnel lens arrays.

The diode bar comprises beamlets (205–208) emitted from diode bar with a slow axis represented by line 209 as explained with respect to FIG. 2. The lines of equal phase-retardation in the Fresnel lenses 410–413 are aligned at an angle of ±45° with respect to the slow axis of the diode bar. The central symmetry lines (410–413) of each of the Fresnel lenses is indicated by the dashed lines in FIG. 4B. Just as for grin lenses, Fresnel lenses of a rhombic shape allow the tightest packing of the individual diode emitters inside the diode array. For low fill factor bars the Fresnel lenses can be arranged side by side similar to the layout displayed in FIG. 1. The layout of the Pretzel lens arrays can for example be defined photolithographically according to the exact design of the diode bars.

Though Fresnel lenses allow for nearly aberration free imaging, their optical bandwidth is generally very limited (1–10 nm), because they are based on mainly diffractive rather than refractive optics. To achieve a larger optical bandwidth, the Fresnel lens pairs can be replaced with pairs of aspheric cylindrical lenses. An example of a single pair of aspheric cylindrical lenses is shown in FIG. 5. Here the device 500 comprise a planar substrate 501, onto which two opposing aspheric cylindrical lens surfaces 503, 504 are fabricated. The axis of the aspheric cylindrical lenses is parallel to the line 502, which itself is aligned at an angle of ±45° with respect to the slow axis of the diode bar (not shown). The two aspheric cylindrical surfaces 503, 504 are separated by a distance of two times their focal length measured between planes normal to the outer edges of the lenses. This structure produces a beam inversion, i.e., the relative position of optical rays 505, 506 is inverted after propagation through the aspheric cylindrical lens pair. Beam-shaping of diode bars with high fill factors can again be obtained by defining aspheric cylindrical surfaces with a rhombic form and aligning them next to each other, similar to the layout in FIGS. 2 and 4B, where the cylinder axis is aligned at an angle of ±45° with respect to the slow axis of the diode bar. Because the lenses are chosen to have an aspheric form, spherical aberrations can be greatly reduced, allowing the use of high NA optics, which is required for beam-shaping of high fill factor bars. Equally, aspheric lenses of toroidal form with different curvatures along two orthogonal axes can be chosen to minimize spherical aberrations and astigmatism.

Figure 6:
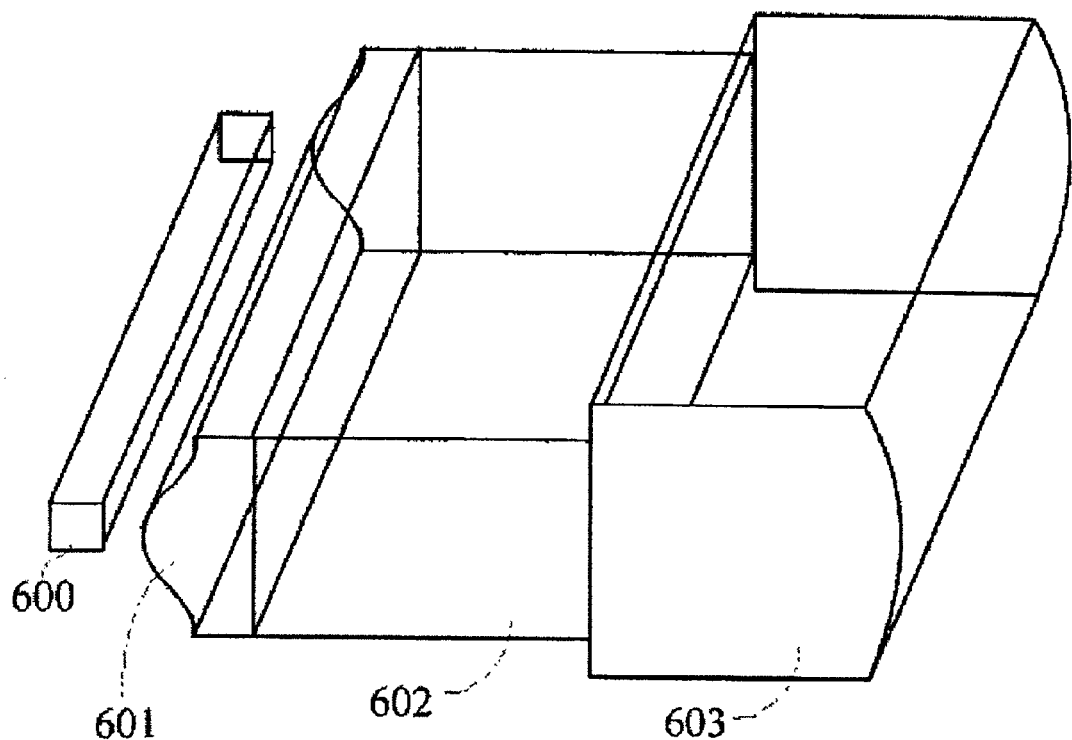
FIG. 6 is a diagram of an integrated beam-shaping optical element, comprising fast axis collimation and beam rotation according to an embodiment of the present invention.

Cost is a critical factor in the construction of high brightness, high-power diode systems. Therefore a high degree of integration is sought. The grin lens array described with reference to FIGS. 2, 4 and 5 lends itself to such a high degree of integration. An example of an integrated fast axis collimation lens, a beam-rotating element and an additional slow axis beam collimation lens is shown in FIG. 6. Laser diode bar 600 is first collimated along the fast axis by aspheric cylindrical lens 601. Aspheric cylindrical lens 601 can be glued or fused directly to beam-rotating lens array 602, which can consist of grin, Fresnel or aspheric cylindrical lenses. When using aspheric cylindrical lenses for beam rotation, a small gap is preferably incorporated between aspheric cylindrical lens 601 and beam-rotating lens array 602 to ensure proper operation of array 602. In principle, however, a medium with a refractive index smaller than the index of the actual lens surfaces in array 602 can be deposited on top of the aspheric cylindrical lens array 602 to obtain a flat surface finish enabling direct bonding without air gaps of the aspheric cylindrical lens array 602 to the fast axis collimation lens formed by aspheric cylindrical lens 601.

Beam collimation element 603 can be glued, bonded or fused to the back end of the beam-rotating lens array 602 to form a quasi-monolithic single optical element. Again a small gap can be incorporated between element 602 and array 603 when using aspheric cylindrical lenses, rendering a device which is not quasi-monolithic. (As used herein, the terms "quasi-monolithic" refers to optical elements formed separately and thereafter physically attached or joined such that an optical beam traversing the optical elements never is exposed to air, not quasi-monolithic refers to a device where the optical beam traversing the optical elements is exposed to air. At least quasi-monolithic is meant to apply to both quasi-monolithic and truly monolithic structures.) As yet another alternative, the fast axis collimating element can be constructed from another grin or Fresnel lens structure aligned parallel to the plane comprising the slow axis of the diode bar and the beam propagation direction. Similarly, the beam collimation element can be constructed from another grin or Fresnel lens structure. Such implementations are not separately shown.

An optimum performance is achieved when both the divergence and size in the x and y axes are the same. Note that unequal beam sizes $s_x$, $s_y$ along the x and y axes respectively can also be tolerated. In this case it should hold for the ratio of the divergences $d_x/d_y$ along the x and y axis, $d_x/d_y=s_y/s_x$ to enable optimum focusing into an optical fiber with additional cylindrical lenses. For coupling the diode output into an optical fiber, an arrangement as described in FIG. 3 can be used, where elements 302, 200, 303 are directly replaced by elements 601, 602 as well as 603 in FIG. 6.

An example 700 of an ultra-compact monolithic beam-shaping optical element as used for optimum coupling of a diode bar 701 into an optical fiber is shown in FIG. 7. The element comprises an aspheric cylindrical collimation lens 702, a beam-rotating lens array 703, a slow axis collimation element 704, fiber coupling optics 705, 706 and fiber 707. For clarity and to show orientation of the elements, a coordinate system is drawn at the top of FIG. 7. The diode beam is assumed to propagate in the z direction with the slow axis aligned parallel to the x axis. The symmetry axes (planes of equal refractive index for grin lenses, axes of equal phase retardation for Fresnel lenses, the cylinder axis for aspheric cylindrical lenses) of the beam-shaping array lenses are aligned at an angle of ±45° with respect to the x axis. The three cylindrical lenses 704, 705, 706 are typically sufficient to obtain diffraction-limited coupling of the shaped diode bar beam into the optical fiber 707.

In yet another alternative embodiment, the beam rotation elements described with respect to FIGS. 2, 4, 5 can also be used to enable efficient coupling of a single emitter diode laser into an optical fiber. An example of such an arrangement is shown in FIG. 8. A single-emitter diode laser element with a length of around 1×500 µm is optimal, though a slow axis as short as 100 µm and as long as 1 mm could also be used. A lens array 800, comprising 4 individual beam-shaping lenses 801, 802, 803, 804 is used, where the symmetry axes of the beam-rotating lens elements are aligned successively to be at an angle of +45° or −45° with respect to the slow axis of the emitter. As a result the symmetry axes of adjacent beam-rotating lenses are aligned parallel to each other (adjacent symmetry planes may equally be aligned orthogonal to each other). The central symmetry axes for the beam-rotating lenses are indicated by the thick diagonal lines. The form of the laser emission after fast axis collimation is represented as the light gray shaded region in FIG. 8. After beam rotation by element 800, a beam pattern comprising 4 beamlets as represented by the dark shaded region in FIG. 8 is obtained. Additional cylindrical and spherical optics can then be used to couple the beam into a fiber with a diameter of 100 µm with a NA<0.20. In alternative embodiments more than 4 or less than 4 individual beam-shaping elements in a beam shaper can be used.

The systems described above can equally be used for beam-shaping of diode stacks, i.e., beam-shaping elements as described in FIGS. 2, 4, 5 can be stacked in the vertical and horizontal direction by using two-dimensional arrays of beam-shaping lenses as shown in FIGS. 9A and 9B. In FIG.

9A a two-dimensional beam-shaping element 900 for two vertically stacked diode bars 901, 902, includes two arrays of beam-rotating lenses 903 and 904. These arrays are preferably directly fabricated on a planar substrate. To enable fiber coupling an arrangement as shown in FIG. 9B can be used, where diode bars 910, 911 are aligned with their slow axis parallel to the x axis, as defined by the shown coordinate system. The diode bars are beam shaped in a two dimensional lens array 912 similar to the one shown in FIG. 9A; here it is further shown that the fast axis collimation lenses are directly attached to the two dimensional beam-shaping lens array. Generally, the fast-axis collimation lenses can be separated from the two-dimensional beam-shaping lens array. Equally, instead of a two dimensional beam-shaping lens array an arrangement of single-dimensional beam-shaping lens arrays can be used, which can be placed in their proper position with opto-mechanical holders. Such an arrangement is not separately shown.

A stacked cylindrical lens array 913 is subsequently used to collimate the slow axis of the rotated beams and cylindrical lenses 914, 915 are employed to couple the diode stack into fiber 916. Further stacking in the vertical and horizontal direction is possible. Coupling of nearly up to 2 kW of power into a 1 mm diameter fiber is possible with such an optical design using an array of 20 state of the art 100 W diode bars.

Figure 10A:
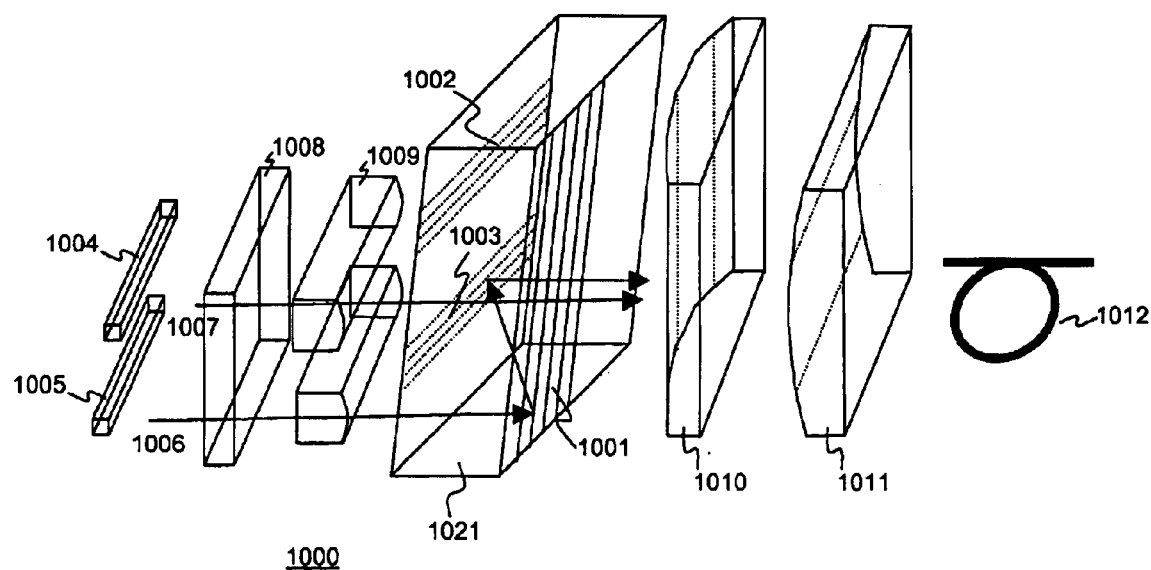
FIG. 10A is a diagram of the operation principle of a beam-cutting optical element according to an embodiment of the present invention.
Figure 10B:
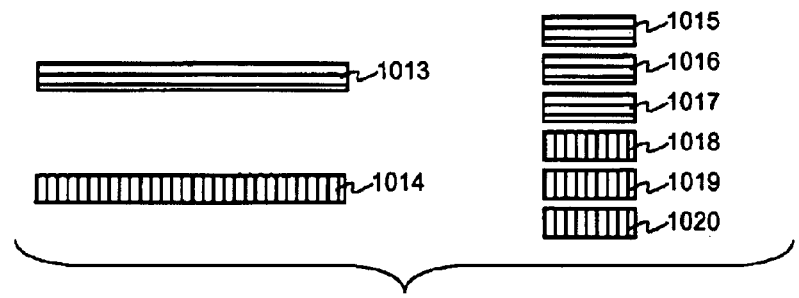
FIG. 10B is a diagram of the orientation of the optical beam emitted from two diode bars before (left) and after (right) optical beam cutting.
Figure 10C:
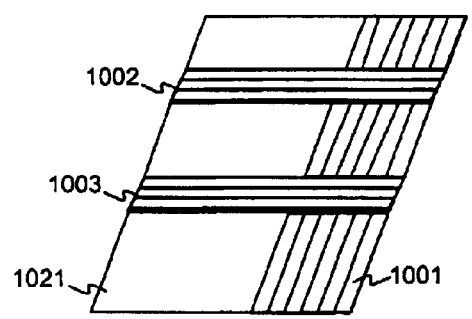
FIG. 10C is a diagram of beam-shaping and beam cutting optic to facilitate fiber coupling of a diode laser stack according to an embodiment of the present invention.

Some applications require coupling of just a few bars into an optical fiber. To minimize the fiber diameter required for efficient coupling, optical cutting of the beam in addition to beam-rotation may be implemented. Such a design is illustrated in FIGS. 10A–10C. In FIG. 10A, an assembly 1000 comprising an optical beam cutting device 1021 is shown. The beam cutting device 1021 is based on a parallelepiped coated with multiple reflective stripes. The parallelepiped element 1021 is shown in detail in FIG. 10C. The back-surface of the parallelepiped is reflection coated with a single-stripe (1001), whereas the front surface is reflection coated with one or several stripes (1002, 1003).

As illustrated in FIG. 10A, two exemplary diode bars (1004, 1005) with their fast axes collimated, are vertically stacked on top of each other. The diode bar beams are subsequently beam-shaped by the beam-rotating element 1008 and the beam-rotated slow axis is collimated with cylindrical lens array 1009. The parallelepiped optical element 1021 cuts the diode bar beams 1013, 1014 (as shown in FIG. 10B) horizontally and realigns the optically cut beams 1015–1020 in the vertical direction as shown in FIG. 10B. Here beamlets 1015–1017 originate from beam 1013 and equally, beamlets 1018–1020 originate from beam 1014. When using two reflective stripes 1002 and 1003 (rather than only one reflective stripe), the required vertical and horizontal displacement (for beam-shaping) of each beamlet in the parallelepiped is minimized, minimizing the optical path delay of the beams in the parallelepiped and increasing the focussability of the beam.

The optical cutting and realignment function performed by the parallelepiped can be understood from FIG. 10A by considering the optical rays 1006 and 1007, emitted at opposite ends of collimated diode bar 1005. Ray 1007 passes the parallelepiped 1021 without any reflection and only a horizontal and vertical deflection (not shown). Ray 1006 is reflected from the back-surface 1001 of the parallelepiped 1021 towards the front-surface 1003 of parallelepiped 1021. From surface 1003, the beam is reflected to align vertically on top of ray 1007 and exits the parallelepiped.

Considering that diode bar beams have a typical extension of 10 mm along their slow axis, the parallelepiped can be designed to cut the beam not only once, but several times. To cut the beam three times, the parallelepiped is aligned such that one third of the diode bar beam propagates through the parallelepiped without reflections. After two reflections inside the parallelepiped, another third of the beam leaves the parallelepiped aligned vertically on top of the first third. After two more internal reflections, the last third of the beam leaves the parallelepiped, stacked vertically on top of the other two thirds and so forth. However, to minimize any loss in brightness suffered by propagation through the parallelepiped, the use of two beam cutters in succession maybe sometimes preferred (such an implementation is not separately shown).

The operation of the optical beam cutter with respect to one stack of M diode bars can be described mathematically by considering the Lagrange invariant (divergence xbeam-size) along both axis:

$$D_x L \rightarrow (1/N) D_x L$$

$$D_y(Mt+H) \rightarrow D_y(Mt+NH), \quad (1)$$

where $D_{x,y}$ are the angular divergences along the x and y axes respectively, L and H are the length and height of a diode bar beam respectively, t is the vertical bar separation and N is the number of optical cuts performed. It can be seen that a reduction of the Lagrange invariant results in the x axis, whereas the Lagrange invariant along the y axis stays substantially the same; since Mt>>NH in any practical application of beam cutting of diode stacks. Hence any asymmetries in the Lagrange invariant along the two axis can be minimized, which in turn optimizes the coupling efficiency into a fiber with the smallest possible diameter. The same method may further be used to couple a 10 mm long bar into a fiber with a diameter of only 150 $\mu$m or simplify coupling of such a bar into a 200 $\mu$m fiber. The function of keeping the Lagrange invariant the same in one axis, while reducing the Lagrange invariant in a second axis is in contrast to prior art beam-shaping mirror structures (e.g., as described in the '551 patent of Neilson et al.), where the reduction in the Lagrange invariant along one axis goes along with a corresponding increase in the Lagrange invariant along the orthogonal axis.

Figure 11:
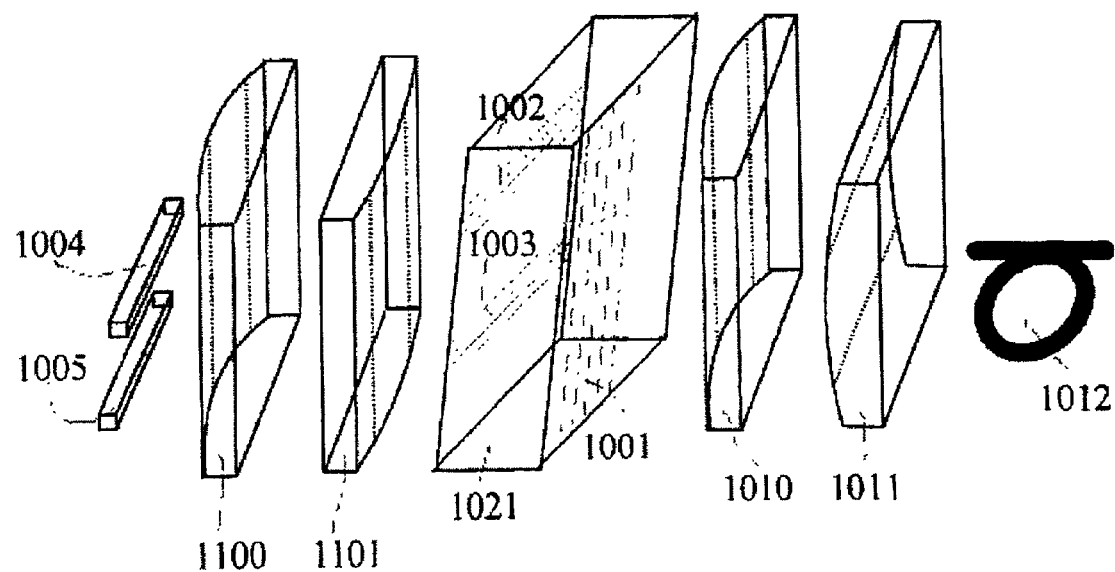
FIG. 11 is a diagram of an optical beam expander and cutter to facilitate fiber coupling of a diode laser stack according to an embodiment of the present invention.

The use of an optical beam cutter as explained with reference to FIG. 10 further allows simplification of diode stack coupling into optical fibers without the use of micro-optics as shown in FIG. 11. The arrangement is very similar to FIG. 10, however, the beam-rotating array 1008 and the cylindrical lens array 1009 are replaced with a cylindrical telescope comprising lenses 1100, 1101, which expands the beams emitted from the diode bars along the slow-axis. The operation of the optical beam cutting device is very similar to the operation described in FIG. 10. Again, the beam is reshaped, leaving the Lagrange invariant substantially unchanged in one axis and decreasing along a second axis.

Figure 12:
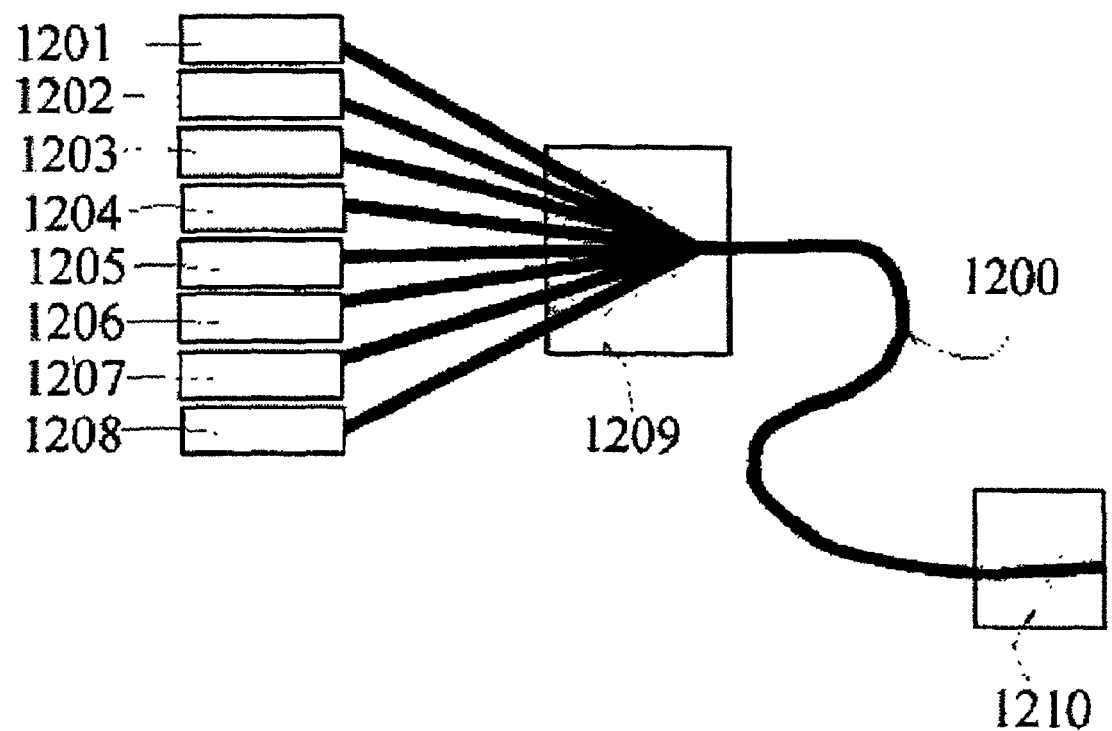
FIG. 12 is a diagram of a fiber bundle combining the output of several diode bars into an ultra-high power optical beam according to an embodiment of the present invention.

To avoid the use of diode stacks, individual fiber coupled diode bars can be combined in fiber bundles to provide optical beams with ultra-high powers. Such an embodiment is shown in FIG. 12. To avoid damage of the fiber bundle 1200, each fiber should be metal coated. The individual fibers can then be fused together and attached to additional heat sinks 1209 and 1210 to increase heat tolerance, i.e., the damage threshold. Here a fiber bundle 1200 with 8 individual fibers is shown in FIG. 12. The corresponding coupling arrangements comprising beam-shaped diode bars are denoted by numbers 1201–1208. Assuming that each fiber contains 100 W of optical power, the generation of high-power kW beams with just a few fibers poses no problem.

Further scaling to 10s of kWs is possible by increasing the number of fibers. The diameter of the fiber bundle can further be decreased by tapering the fibers to a smaller diameter prior to creating the bundle. The individual fibers can be fused together to maximize the overall brightness of the source. To minimize any brightness reduction in fiber coupling and fission, square or rectangular fiber cross sections may be implemented.

In all of the above embodiments, various methods of attaching the diode bars to heat sinks can be incorporated. There are no restrictions whether to mount the bars horizontally or vertically. An eventual preference is only determined by packaging consideration. Also note that the individual optical elements may be formed separately and later joined by gluing, fusing, bonding, etc. to form a quasi-monolithic single optical element. Alternatively, individual optical elements may be machined or otherwise formed on or in a common monolithic substrate to form a single monolithic optical element. For purposes of the present description, the term "quasi-monolithic" includes both separate elements joined together and elements initially formed on a common, monolithic substrate.

In this disclosure there is shown and described only the preferred embodiments of the invention and but a few examples of its versatility. It is to be understood that the invention is capable of use in various other combinations and environments and is capable of changes or modifications within the scope of the inventive concept as expressed herein. Further, it should be noted and understood that all publications, patents and patent applications mentioned in this specification are indicative of the level of skill in the art to which the invention pertains. All publications, patents and patent applications are herein incorporated by reference to the same extent as if each individual publication, patent or patent applications was specifically and individually indicated to be incorporated by reference in its entirety.

What is claimed is:

1. An optical system, comprising:
   a diode laser having an active area substantially elongated along and parallel to a slow axis of said diode laser, said active area configured to emit an optical beam;
   a fast axis collimation lens configured to collimate a fast axis of said optical beam; and
   an optical beam inverting array comprising a planar grin lens array and including a plurality of individual array elements aligned such that said optical beam is cut into more than two individual beam sections, said optical beam inverting array configured such that said beam sections propagate through said individual array elements, each of said individual array elements imaging said individual optical beam sections with a magnification M of substantially M=−1,
   wherein planes of equal refractive index in said planar grin lens array are aligned at an angle of substantially ±45° with respect to a plane defined by a propagation direction of said optical beam and said slow axis of the diode laser.

2. The planar grin lens array according to claim 1, wherein a pitch of said planar grin lens array is equal to approximately 0.5.

3. An optical system comprising:
   a diode laser having an active area substantially elongated along and parallel to a slow axis of said diode laser, said active area configured to emit an optical beam:
   a fast axis collimation lens configured to collimate a fast axis of said optical beam; and
   an optical beam inverting array comprising two sets of cylidrical Fresnel lens arrays with their optical axes oriented at an angle of substantially ±45° with respect to said slow axis of said diode laser, said optical beam inverting array including a plurality of individual array elements aligned such that said optical beam is cut into more than two individual beam sections, said optical beam inverting array configured such that said beam sections propagate through said individual array elements, each of said individual array elements imaging said individual optical beam sections with a magnification M of substantially M=−1.

4. The optical system according to claim 3, wherein said Fresnel lens arrays are separated by approximately twice their focal lengths.

5. An optical system comprising:
   a diode laser having an active area substantially elongated along and parallel to a slow axis of said diode laser, said active area configured to emit an optical beam;
   a fast axis collimation lens configured to collimate a fast axis of said optical beam; and
   an optical beam inverting array comprising two sets of aspheric cylindrical lens arrays with their optical axes oriented at an angle of substantially ±45° with respect to said slow axis of said diode laser, said optical beam inverting array including a plurality of individual array elements aligned such that said optical beam is cut into more than two individual beam sections, said otical beam inverting array configured such that said beam sections propagate through said individual array elements, each of said individual array elements imaging said individual optical beam sections with a magnification M of substantially M=−1.

6. The optical system according to claim 5, wherein said aspheric cylindrical lens arrays are separated by twice their focal lengths.

7. An optical system comprising:
   a diode laser having an active area substantially elongated along and parallel to a slow axis of said diode laser, said active area configured to emit an optical beam;
   a fast axis collimation lens configured to collimate a fast axis of said optical beam; and
   an optical beam inverting array comprising two sets of toroidal aspheric cylindrical lens arrays with their optical axes oriented at an angle of substantially ±45° with respect to said slow axis of said diode laser, at least one of said toroidal aspheric cylindrical lens array with non-zero curvatures along two orthogonal axes, said optical beam inverting array including a plurality of individual array elements aligned such that said optical beam is cut into more than two individual beam sections, said optical beam inverting array configured such that said beam sections propagate through said individual array elements, each of said individual array elements imaging said individual optical beam sections with a magnification M of substantially M=−1.

8. The optical system according to claim 7, wherein said toroidal aspheric cylindrical lens arrays are separated by approximately twice the focal length of a surface thereof having a largest curvature.

9. The optical system according to claim 1, further comprising a coupling element configured to couple said optical beam of the diode laser beam into an optical fiber.

10. The optical system according to claim 9, wherein said coupling element comprises optical elements selected from the group consisting of cylindrical, spherical and aspherical optical elements.

11. The optical system according to claims 9, wherein a core of said optical fiber is shaped substantially in the form of a rectangle.

12. The optical system according to claim 1, comprising:
a plurality of said laser diode each emitting a respective optical beam, said laser diodes arranged in a two-dimensional array;
a plurality of said fast axis collimation lens and a corresponding plurality of said beam inverting array comprising individual array elements aligned such that said optical beams are cut into individual beam sections; and
said individual array elements arranged to propagate said beam sections, each of said individual array elements imaging said individual optical beam sections with a magnification M of substantially M=−1.

13. The optical system according to claim 12, further comprising coupling elements for coupling the plurality of diode laser beams into an optical fiber.

14. The optical system according to claim 13, further comprising a plurality of said optical fibers each associated with a respective one of said coupling element for receiving a respective one of said diode laser beams.

15. The optical system according to claim 14 wherein each of said plurality of optical fibers is formed to have a cross-section substantially in the form of a rectangle.

16. The optical system according to claim 1, comprising a plurality of subsystems of said diode laser, fast axis collimation lens, an optical beam inverting array, said diode lasers coupled into a plurality of optical fibers, said optical fibers aligned to form at least one optical fiber bundle so as to provide at least one beam of ultra-high optical power.

17. An optical system, comprising:
a diode laser, including an array of active areas substantially elongated along and parallel to slow axes of said active areas, said active areas further arranged to be separated by substantially equal distances along an axis orthogonal to said slow axes, said array of active areas emitting a plurality of optical beams;
an array of fast axis collimation lenses for fast axis collimation of said plurality of optical beams; and
a monolithic optical element arranged such that said optical beams are cut into at least two individual beam sections, each of said beam sections propagating through said monolithic optical element, thereby defining an input optical beam and an output optical beam, said monolithic optical element characterized in that the Lagrange invariant of the output beam is reduced by substantially a factor of two along a first axis and increased by less than a factor of two along a second axis orthogonal to said first axis.

18. An optical system according to claim 17, where said monolithic optical element is characterized in that the Lagrange invariant of the output beam is reduced by substantially a factor of 1/x along said first axis and increased by less than a factor of x along said second axis.

19. An optical system according to claim 17, comprising a plurality of said monolithic optical elements arranged such that said optical beams pass through the optical elements successively characterized in that the Lagrange invariant of the output beam of the optical system is reduced by substantially a factor of $^1/_x$ along a first axis and increased by less than a factor of x along a second axis orthogonal to said first axis.

20. An optical system according to claim 17, where the monolithic optical element comprises:
an optically transmissive substrate;
a substantially planar first surface formed on said substrate, said first surface vertically partitioned to form inwardly facing mirror portions and optically clear portions; and
a substantially planar second, surface formed on said substrate substantially parallel to said first surface, said second surface horizontally partitioned to form an inwardly facing mirrored portion and an optically clear portion.

21. The optical system according to claim 3, further comprising a coupling element configured to couple said optical beam of the diode laser beam into an optical fiber.

22. The optical system according to claim 21, wherein said coupling element comprises optical elements selected from the group consisting of cylindrical, spherical and aspherical optical elements.

23. The optical system according to claims 21, wherein a core of said optical fiber is shaped substantially in the form of a rectangle.

24. The optical system according to claim 3, comprising:
a plurality of said laser diode each emitting a respective optical beam, said laser diodes arranged in a two-dimensional array;
a plurality of said fast axis collimation lens and a corresponding plurality of said beam inverting array comprising individual array elements aligned such that said optical beams are cut into individual beam sections; and
said individual array elements arranged to propagate said beam sections, each of said individual array elements imaging said individual optical beam sections with a magnification M of substantially M=−1.

25. The optical system according to claim 24, further comprising coupling elements for coupling the plurality of diode laser beams into an optical fiber.

26. The optical system according to claim 25, further comprising a plurality of said optical fibers each associated with a respective one of said coupling element for receiving a respective one of said diode laser beams.

27. The optical system according to claim 26 wherein each of said plurality of optical fibers is formed to have a cross-section substantially in the form of a rectangle.

28. The optical system according to claim 3, comprising a plurality of subsystems of said diode laser, fast axis collimation lens, an optical beam inverting array, said diode lasers coupled into a plurality of optical fibers, said optical fibers aligned to form at least one optical fiber bundle so as to provide at least one beam of ultra-high optical power.

29. The optical system according to claim 5, further comprising a coupling element configured to couple said optical beam of the diode laser beam into an optical fiber.

30. The optical system according to claim 29, wherein said coupling element comprises optical elements selected from the group consisting of cylindrical, spherical and aspherical optical elements.

31. The optical system according to claims 29, wherein a core of said optical fiber is shaped substantially in the form of a rectangle.

32. The optical system according to claim 5, comprising:
a plurality of said laser diode each emitting a respective optical beam, said laser diodes arranged in a two-dimensional array;
a plurality of said fast axis collimation lens and a corresponding plurality of said beam inverting array comprising individual array elements aligned such that said optical beams are cut into individual beam sections; and said individual array elements arranged to propagate said beam sections, each of said individual array elements imaging said individual optical beam sections with a magnification M of substantially M=−1.

33. The optical system according to claim 32, further comprising coupling elements for coupling the plurality of diode laser beams into an optical fiber.

34. The optical system according to claim 33, further comprising a plurality of said optical fibers each associated with a respective one of said coupling element for receiving a respective one of said diode laser beams.

35. The optical system according to claim 34 wherein each of said plurality of optical fibers is formed to have a cross-section substantially in the form of a rectangle.

36. The optical system according to claim 5, comprising a plurality of subsystems of said diode laser, fast axis collimation lens, an optical beam inverting array, said diode lasers coupled into a plurality of optical fibers, said optical fibers aligned to form at least one optical fiber bundle so as to provide at least one beam of ultra-high optical power.

37. The optical system according to claim 7, further comprising a coupling element configured to couple said optical beam of the diode laser beam into an optical fiber.

38. The optical system according to claim 37, wherein said coupling element comprises optical elements selected from the group consisting of cylindrical, spherical and aspherical optical elements.

39. The optical system according to claims 37, wherein a core of said optical fiber is shaped substantially in the form of a rectangle.

40. The optical system according to claim 7, comprising:

a plurality of said laser diode each emitting a respective optical beam, said laser diodes arranged in a two-dimensional array;

a plurality of said fast axis collimation lens and a corresponding plurality of said beam inverting array comprising individual array elements aligned such that said optical beams are cut into individual beam sections; and said individual array elements arranged to propagate said beam sections, each of said individual array elements imaging said individual optical beam sections with a magnification M of substantially M=−1.

41. The optical system according to claim 40, further comprising coupling elements for coupling the plurality of diode laser beams into an optical fiber.

42. The optical system according to claim 41, further comprising a plurality of said optical fibers each associated with a respective one of said coupling element for receiving a respective one of said diode laser beams.

43. The optical system according to claim 41 wherein each of said plurality of optical fibers is formed to have a cross-section substantially in the form of a rectangle.

44. The optical system according to claim 7, comprising a plurality of subsystems of said diode laser, fast axis collimation lens, an optical beam inverting array, said diode lasers coupled into a plurality of optical fibers, said optical fibers aligned to form at least one optical fiber bundle so as to provide at least one beam of ultra-high optical power.

* * * * *